Feb. 28, 1939. W. VAN B. ROBERTS Re. 21,018
COMBINED AUTOMATIC VOLUME AND TONE CONTROL
Original Filed April 29, 1930
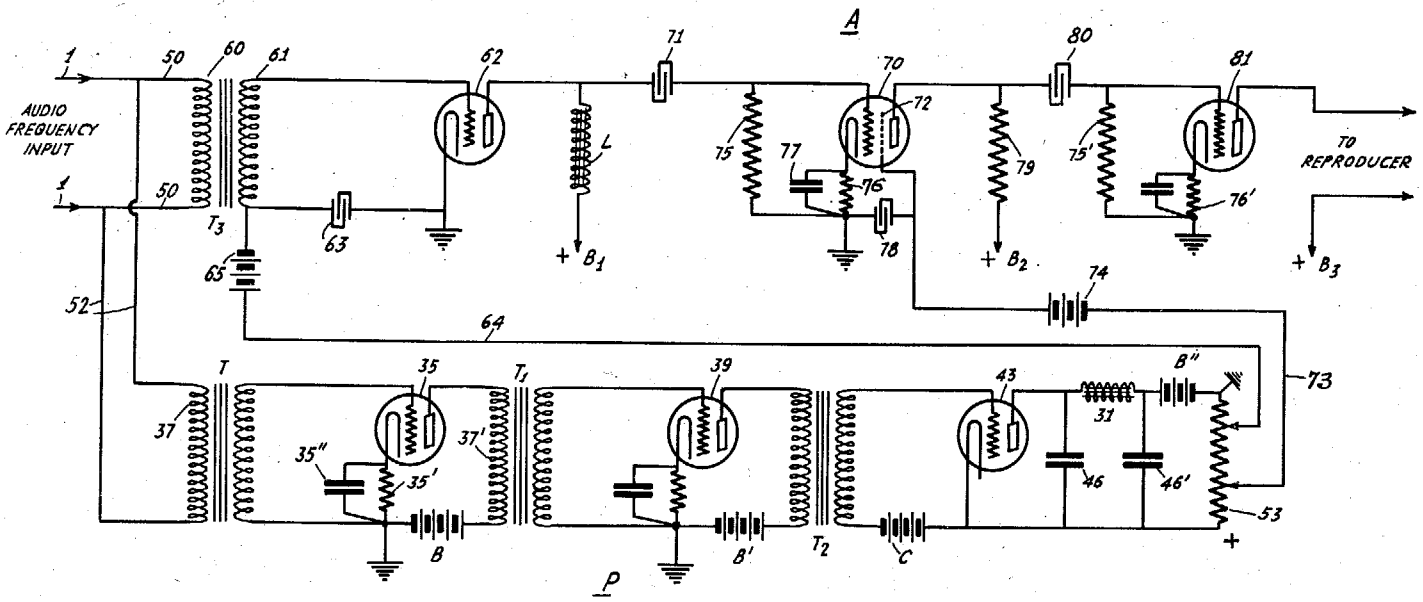
INVENTOR
WALTER VAN B. ROBERTS
BY
ATTORNEY Reissued Feb. 28, 1939

Re. 21,018

UNITED STATES PATENT OFFICE 21,018

COMBINED AUTOMATIC VOLUME AND TONE CONTROL

Walter van B. Roberts, Princeton, N. J., assignor to Radio Corporation of America, a corporation of Delaware Original No. 1,993,861, dated March 12, 1935, Serial No. 448,206, April 29, 1930. Application for reissue August 14, 1936, Serial No. 96,127

24 Claims. (Cl. 179—171)

My present invention relates to acoustic reproducing devices, and more particularly to a combined automatic volume and tone control system adapted for use with audio frequency currents.

In my copending application Serial Number 446,202 filed April 22, 1930, patented March 12, 1935 as U. S. P. 1,993,859 there has been disclosed a control system for audio reproduction devices, the utilization of the control resulting in a greater contrast between the maximum and minimum loudness during the reproduction of a sound passage, and simultaneously preserving fidelity of reproduction, or tonal quality, by proper proportioning of the low and high audio frequencies during all variations of volume. In short, means was disclosed in the aforementioned patent for automatically controlling both the total amplification of an audio amplifying system, and, also, the ratio of low frequency to high frequency amplification in accordance with the average audio input intensity.

Briefly, the embodiment for accomplishing these results comprised a plurality of selective amplifiers, each of which was arranged to stress a predetermined, independent portion of the audible spectrum, and a control, or pilot circuit, for automatically regulating, in a predetermined manner and in accordance with the input to the amplifiers, the tone of the audio output of the amplifiers, as well as the total amplification of the latter. Additional investigation, however, has revealed the fact that in some cases, the aforedescribed embodiment may be unsatisfactory. The latter may be ascribed to a phase difference phenomenon occurring between the currents during transmission through the independent amplifiers, and becoming manifest upon the recombination of the amplified currents.

Now, I have discovered a method of obviating such a phenomenon, by utilizing only a single multi-stage audio amplifier, and controlling both the total gain and the frequency characteristics of the said amplifier.

Accordingly, it is one of the main objects of my present invention to provide a method of, and means for, controlling an audio amplifier which consists in varying the total amplification of the amplifier in a predetermined direction and in accordance with the average audio input intensity, and simultaneously varying the ratio of low to high audio frequency amplification in the opposite direction.

Another important object of the invention is to provide a method of and means for, controlling the tone and volume of a single multi-stage audio amplifier, which consists in employing one of the stages of the amplifier for varying the total amplification of the amplifier in a predetermined direction and in accordance with the average audio input intensity, and, additionally, utilizing another stage of the amplifier for varying the ratio of low to high audio frequency amplification in the opposite direction.

Another object of the invention is to provide a single, multi-stage audio amplifier circuit, one stage of which circuit is employed for automatically controlling the tone of the amplifier and another stage of which is employed for automatically and simultaneously controlling the volume of the amplifier, both tone and volume being regulated in accordance with the acoustical conditions within the range of the amplifier reproducer.

Still other objects of the invention are to improve generally the efficiency of audio amplifiers, and to provide a combined volume and tone control system for audio amplifiers which is not only reliable in operation, but automatic in regulation, and economical in circuit arrangement.

The novel features which I believe to be characteristic of my invention are set forth in particularity in the appended claims, the invention itself, however, as to both its organization and method of operation will best be understood by reference to the following description taken in connection with the drawing in which I have indicated diagrammatically one circuit arrangement whereby my invention may be carried into effect.

Referring to the accompanying drawing, which presents diagrammatically a circuit embodying my invention, an audio amplifier circuit is shown, the input leads 1 of which have impressed across them modulated audio input energy. The input energy may be derived from any desired source such as, the output circuit of the detector stage of a radio telephone receiver; the output terminals of an electromagnetic pick-up device or other electric phonograph device; the output terminals of the microphone arrangement of a public address system; the output terminals of the photoelectric device of a sound motion picture arrangement; or, any other source of modulated audio frequency currents. I have not shown any of these sources in the drawing connected to leads 1, for the reason that they are well known to those skilled in the art; and, additionally, to preserve simplicity of description throughout this specification.

The audio frequency input, applied to the input leads 1, is divided into two paths. One of these paths, by means of leads 50, conducts the input current into a single, multi-stage audio amplifier A; a second path, by means of leads 52, conducts the audio input current into a regulating, auxiliary, or pilot circuit P. It will be recognized that these two essential elements of the invention are basically similar to the elements of the invention disclosed in my aforementioned patent.

The regulating, or pilot circuit P, consists of one, or more, stages of audio amplification and a rectifier stage, the regulating circuit shown in the drawing specifically including in the input circuit of the first audio stage a triode 35, the control electrode of which triode is negatively biased by means of a resistance 35' disposed in the negative leg of the triode filament, the biasing resistance being shunted by a by-pass capacity 35''. An audio transformer T couples the input circuit of the triode to the leads 1, the latter being connected by the leads 52 to the primary coil 37 of the transformer T.

The anode of the triode 35 has potential applied to it from a source B, through the primary coil 37' of a second audio transformer $T_1$. The secondary coil of the transformer $T_1$ is connected across the input circuit of the triode 39 of the second audio stage, the control electrode of the triode 39 being biased in a manner similar to the control electrode of the triode 35. The anode of the triode 39 has potential applied to it from a source B' through the primary coil of the third audio transformer $T_2$, it being apparent that the source B could also be used to supply potential to the anode of the triode 39.

A third triode 43 is connected to the output circuit of triode 39 through the audio transformer $T_2$ the control electrode of the triode 43 being negatively biased by a source C, to operate it as a rectifier stage. The anode of triode 43 has potential applied to it from a source B'', the positive terminal of the said source being connected to the anode of triode 43 through a choke coil 31. A capacity 46 is connected in series with the choke coil 31, and is shunted across the output terminals of the triode 43.

A second capacity 46' is connected in series with the choke coil 31, and in parallel with the capacity 46, between the choke coil and the positive terminal of the source B''. The negative terminal of the latter is connected to one terminal of a resistance 53, while the opposite terminal of the latter is connected to one side of the capacity 46', the first terminal of the resistance 53 being grounded.

It will, thus, be seen that there is connected to the source of audio frequency current, the input circuit of a pilot, or controlling circuit P, which circuit consists of one or more stages of audio amplification, which stages may be of any desired type, feeding a rectifier, such as an electron discharge tube of the triode type. The control electrode of the rectifier tube is provided with sufficient bias to reduce the plate current of the tube to a small value in the absence of impressed voltages upon the control electrode. The triode 43 acts as the rectifier, the biasing source C biasing the control electrode of the triode 43, to sufficiently reduce the anode current of the triode to a small value, in the absence of amplified voltages from the output circuit of the triode 39, which amplified voltages are to be impressed upon the control electrode of the triode 43.

The rectified output of the triode 43 is smoothed out by the filter arrangement consisting of the capacity 46, the choke coil 31 and the capacity 46', the latter being designed in such a manner that the current output of the filter arrangement varies only slightly with variations in audio input intensity. The output of the pilot amplifier, rectifier and filter, is impressed across the potentiometer resistance 53, the grounded end of the resistance being the end of lowest potential.

The leads 50, connected to the audio frequency input, are connected to the primary coil 60 of an audio transformer $T_3$, the secondary coil 61 of the latter being connected across the control electrode and cathode of the triode 62 in the first stage of the audio amplifier A. The negative leg of the cathode of triode 62 is grounded, it being, additionally, connected to one end of the coil 61 through a capacity 63, the same end of the coil 61 being adjustably connected, by a lead 64, to a point on the potentiometer resistance 53 of higher potential than the grounded end of the resistance. A source of current 65 is connected in series in the lead 64, the positive terminal of the source 65 being connected to the adjustable end of the lead 64.

The anode of the triode 62 has potential applied to it from a source $B_1$ (not shown) through a choke coil L, the anode of the triode 62 being connected to the control electrode of a screen grid tube 70, through a capacity 71. The screen element 72, of the screen grid tube, is adjustably connected by a lead 73 to a point on the potentiometer resistance 53 which is of higher potential than the point on the resistance to which the adjustable end of the lead 64 is connected. A source of current 74 is connected in series in the lead 73, the positive terminal of the source being connected to the screen element 72.

The control electrode of the tetrode 70 has negative bias applied to it by means of a resistance 76 disposed in the lead to the cathode of the tetrode, a capacity 77 being shunted across the resistance 76, the latter being grounded at one end thereof. The grounded end of the resistance 76 is connected by a capacity 78 to the screen element 72, there being a grid leak resistance 75 connected to the control electrode of the tetrode 70.

The anode of the screen grid tube 70 has potential applied to it from a source $B_2$ (not shown) through a resistance 79, the anode being connected to the control electrode of the triode 81 of the last audio stage, through a capacity 80. The anode of triode 81 is supplied with potential from a source $B_3$ (not shown) it being understood that the anodes of the three tubes 62, 70 and 81 can have potential applied to them from a common source. The output circuit of the triode 81 may be connected to any type of reproducer such as phones, loud speaker and the like. The control electrode of the triode 81 is negatively biased in a manner similar to the control electrode of the tube 70, a grid leak resistance 75' being connected between the control electrode and the grounded terminal of the bias resistance 76', which bias resistance is disposed in the cathode lead of triode 81.

It will thus be observed that a stage of resistance coupled screen grid amplification is provided in amplifier A, the said stage being preferably designed to have a substantially flat frequency response characteristic, but whose amplification depends upon the potential applied to the screen element 72. The stage of amplification prior to the screen grid stage has an iron cored reactance coil coupling, and this coil L is so designed that its impedance is high even at low frequencies, provided the steady component of current flowing through the coil is small. If the average current through the coil L is increased, the iron core becomes saturated and the inductance decreases so that the amplification of low frequencies is reduced, although the amplification of high frequencies is not reduced to an appreciable extent.

Again, since the steady current flowing through the coil L is determined by the grid potential, it is possible to control the relative amount of low frequency amplification, as compared with high frequency amplification by varying the bias on the control electrode of triode 62. Thus, the bias of the control electrode of the first triode 62 controls the frequency response characteristic of amplifier A, while the potential applied to the screen element 72 of the tube 70 controls the total amplification of the amplifier A. In order to have these two controls automatically operated in response to the intensity of the audio frequency input, the pilot circuit P is provided in which an amplifier feeds a rectifier whose output current is filtered, so as to be determined by the long-period average of audio frequency input intensity.

This filtered current is impressed across the potentiometer resistance 53, the negative end of which is grounded. It is seen that the potential at any other point on the resistance 53 is then positive to an extent determined by the the audio input intensity. The control electrode lead of the first triode 62 is connected to a point on this resistance 53, and the screen element of the second tube 70 to another point on the resistance, the points being so chosen as to give the desired amount of control action. Again, there are included the sources 65 and 74 in the leads 64 and 73 to these two points, which sources bring the normal grid and screen potentials to approximately the values that should exist for very weak audio inputs.

It will thus be seen that the result of strong signals is to decrease the negative potential on the control electrode of the first tube, thus increasing the average anode current, which in turn decreases the low frequency amplification of the first tube. Simultaneously, the increased potential on the screen element of the second tube increases the total amplification of the amplifier A, so as to obtain the desired expansion of the range of loud speaker output intensity.

While I have indicated and described one arrangement for carrying my invention into effect, it will be apparent to one skilled in the art that my invention is by no means limited to the particular organization shown and described, but that many modifications may be made without departing from the scope of my invention as set forth in the appended claims.

What I claim is:

1. In combination with a multi-stage, cascaded audio amplifier, automatic means actuated in accordance with average audio input intensity, for varying the total gain of the amplifier in a predetermined direction, and additional means connected with the first means for simultaneously varying the ratio of low to high frequency amplification in the opposite direction.

2. In combination with a multi-stage audio amplifier, a regulating circuit connected between one of the amplifier stages and the amplifier input for varying the total gain of the amplifier in a desired direction in accordance with audio input level, said circuit being additionally connected to another stage of the amplifier for varying the ratio of low to high frequency amplification of said second stage.

3. In combination with an audio amplifier comprising at least two stages, a pilot circuit having a terminal impedance associated with one of the stages and the amplifier input, and operated in accordance with audio input level, for varying the volume of the amplifier, the other stage having its input circuit, additionally, connected to the said terminal impedance for simultaneously varying the tone of the amplifier output.

4. Means for controlling the relative gain of a vacuum tube audio amplifier with respect to high and low frequencies, said amplifier having a cathode, control electrode and output circuit, a coil in said output circuit, means for normally causing a small direct current to flow through said coil, and means operating on said control electrode to increase the direct current through said coil whereby its inductance is decreased and the gain with respect to low audio frequencies is automatically reduced.

5. The structure recited in claim 4 in which said coil has a core of magnetic material which is normally unsaturated.

6. In combination with a multi-stage audio frequency cascaded amplifier, means connected to one of the stages for varying the gain of the amplifier, a second means connected to said one stage and another stage for varying the tone of the amplifier output, and a rectifier connected between the amplifier input and said first and second means for controlling the operation thereof.

7. The method of electrically transmitting and reproducing audio modulated electrical currents in a multi-stage audio frequency amplifier which consists in impressing the currents upon said amplifier, producing a current whose amplitude is proportional to the envelope of said audio modulated currents, varying in accordance with the amplitude of the current so produced the gain of one stage of the amplifier, and simultaneously varying in another stage the ratio of the amplification of high and low audio frequencies.

8. The method of electrically transmitting and reproducing audio modulated electrical currents in a multi-stage audio frequency amplifier which consists in impressing the currents upon said amplifier, producing a current whose amplitude is proportional to the envelope of said audio modulated currents, varying in accordance with the amplitude of the current so produced the gain of one stage of the amplifier, and simultaneously varying in accordance with said amplitude in another stage of ratio of the amplification of high and low audio frequencies.

9. The method of operating a multi-stage audio frequency amplifier which consists in impressing audio frequency modulated electrical energy upon the amplifier input, rectifying a portion of the energy to produce a current whose amplitude is proportional to the envelope of the impressed energy, varying the gain of at least one stage of the amplifier in accordance with said amplitude, and simultaneously varying in another stage and in the opposite direction the ratio of low to high audio frequency amplification.

10. In combination, an amplifier comprising a plurality of electron discharge tube stages connected in series, means for connecting the amplifier input to a source of alternating current to be amplified, a second means for producing from said current a second current whose amplitude is proportional to the envelope of the alternating current, means for connecting the second means to an amplification control element of a tube of at least one of said stages, and an additional means for connecting said second means to a different amplification control element of a tube of another stage.

11. In combination, an amplifier comprising a plurality of electron discharge tube stages coupled in cascade, means for connecting the amplifier input to a source of alternating current to be amplified, a second means including a rectifier for producing from said current a second current whose amplitude is proportional to the envelope of the alternating current, means for connecting the second means to an amplification control grid element of a tube of at least one of said stages, and an additional means for connecting said second means to a different amplification control element of a tube of another stage.

12. In a signal receiving system, a plurality of amplifying devices, coupling means interconnecting said devices in cascade, means for increasing the high frequency response of the system to a greater extent than the low frequency response through at least one of said coupling means in response to an increase in the amplitude of a signal impressed on the system, and means connected with a point in the system between the said one coupling means and another coupling means for increasing the gain of the system when the said high frequency response is increased.

13. In a signal wave transmission system of the type including a wave input network, an output network, a plurality of wave amplifiers arranged in cascade between the input and output networks, means to vary the gain of at least one tube, additional means for varying the frequency-response characteristic of the system, and means for simultaneously controlling both said means in response to variations in wave amplitude.

14. In a signal transmission system, the combination of automatic volume control means, tone compensating means, and means for simultaneously controlling said automatic volume control and tone compensating means, comprising a single extensible control circuit connected with and common to said means and a device in said circuit for simultaneously varying a controlling potential therethrough.

15. The combination with an electric signal transmission circuit, of means connected with said circuit and responsive to variations in signal strength for controlling the signal amplitude therein, means for controlling the audio frequency output response characteristic thereof, and common means including a single control circuit connected with said first and second named means for simultaneously controlling the operation of said first and second named means.

16. The combination with an electric signal transmission circuit, of means connected with said circuit for controlling the signal amplitude therein, means for controlling the audio frequency output response characteristic thereof, said first and second named means including electric discharge control tubes, means for applying direct current controlling potentials to said tubes, and means for simultaneously varying said potentials.

17. In a sound record system, a pick-up device, an amplifier fed thereby and a translating device fed by said amplifier, said amplifier having a signal input grid and having a control grid for varying the amplification characteristics of the amplifier in accordance with the signal strength.

18. In an energy translating system for use with a sound record, a first translating device, a space discharge device having a grid connected to receive audio-frequency variations from said first translating device and another grid connected to vary the transmission characteristics of said discharge device in accordance with the energy value of said audio-frequency variations, and a second translating device fed by said discharge device.

19. In a sound reproducing system for use with a sound record, a pick-up device, an amplifier fed thereby and a translating device fed by said amplifier, said amplifier comprising a space discharge device having an anode, a first control electrode fed by audio-frequency variations from said pick-up device, and a second control electrode fed by sub-audio frequency variations from said pick-up device for controlling the gain characteristics of said amplifier.

20. The method for obtaining gain variations in a signal amplifier forming part of a sound energy translating system used with a sound record and having an anode and a plurality of control electrodes which comprises introducing audio-frequency variations into said system through one of tne said control electrodes and introducing sub-audio control variations into said system through another of said control electrodes.

21. In a sound translating system for use with a sound record, a first translating device, a space discharge amplifier fed thereby having a cathode, an anode and a signal grid and a second translating device fed by said amplifier, a control circuit for varying the efficiency with which audio-frequency energy is transmitted through said amplifier, said control circuit being arranged to introduce variations into said amplifier solely by electronic coupling independently of said signal grid and in the region between said cathode and said anode.

22. In an audio-frequency amplifying system for use with a sound record, a gain control stage comprising a vacuum tube having an anode, a cathode, a first and a second control electrode, means for applying audio-frequency variations to the first of said control electrodes and means for applying sub-audio control variations to the second of said control electrodes.

23. In a sound reproducing system for use with sound records, a pick-up device, an amplifier fed thereby and a translating device fed by said amplifier, said amplifier comprising a space discharge device having an anode, a first control element fed by said pick-up device and a second control element for varying the amplifying characteristics of said amplifier.

24. In a system for reproducing sound from a sound record, a pick-up device, an amplifier fed thereby and an output device fed by said amplifier, said amplifier having means for varying its gain ratio comprising a control electrode for changing the internal impedance thereof, and means for varying the frequency transmission characteristics of said system responsive to changes in said internal amplifier impedance.

WALTER VAN B. ROBERTS.